US012757746B2

(12) United States Patent
Huang et al.

(10) Patent No.: US 12,757,746 B2

(45) Date of Patent: Oct. 6, 2026

(54) WIRE BONDING USING IN-SITU PLASMA TREATMENT AND APPARATUS FOR EFFECTING THE SAME

(71) Applicant: Taiwan Semiconductor Manufacturing Company Limited, Hsinchu (TW)

(72) Inventors: Hui-Min Huang, Taoyuan City (TW); Chang-Jung Hsueh, Taipei (TW); Chih-Yuan Chiu, Zhudong Township (TW); Jen-Hao Liu, Zhunan Township (TW); Ming-Da Cheng, Taoyuan (TW); Amram Eitan, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 754 days.

(21) Appl. No.: 18/327,925

(22) Filed: Jun. 2, 2023

(65) Prior Publication Data

US 2024/0404839 A1 Dec. 5, 2024

(51) Int. Cl.

| | |
|---|---|
| ***H10W 70/04*** | (2026.01) |
| ***H10W 72/00*** | (2026.01) |
| ***H10W 72/20*** | (2026.01) |

(52) U.S. Cl.

CPC ....... *H10W 70/041* (2026.01); *H10W 72/071* (2026.01); *H10W 72/072* (2026.01); *H10W 72/07235* (2026.01); *H10W 72/247* (2026.01)

(58) Field of Classification Search

None

See application file for complete search history.

(56) References Cited

U.S. PATENT DOCUMENTS

| | | | | |
|---|---|---|---|---|
| 2003/0219987 A1* | 11/2003 | Wang .................. | H10W 72/012 438/720 |
| 2015/0270232 A1* | 9/2015 | Chen ................... | H10W 74/019 257/691 |
| 2019/0157237 A1* | 5/2019 | Lee ..................... | H10W 72/075 |
| 2022/0068668 A1 | 3/2022 | Suzuki et al. | |

FOREIGN PATENT DOCUMENTS

| | | |
|---|---|---|
| CN | 112750550 A | 5/2021 |
| TW | I624920 B | 5/2018 |
| TW | 202137456 A | 10/2021 |
| TW | I759029 B | 3/2022 |

OTHER PUBLICATIONS

TW Patent and Trademarked Office; TW Application No. 112127910; office action mailed Oct. 11, 2024; 10 pages.

* cited by examiner

*Primary Examiner* — Alexander G Ghyka

(74) *Attorney, Agent, or Firm* — The Marbury Law Group, PLLC

(57) ABSTRACT

A bonded assembly may be formed by: providing a substrate and a semiconductor chip in a low-oxygen ambient having an oxygen partial pressure that is lower than 17 kPa; disposing the semiconductor chip on the substrate; performing a plasma treatment process on a copper-containing surface of a chip bonding pad on the semiconductor chip in the low-oxygen ambient by directing a plasma jet to the chip bonding pad; and attaching a bonding wire to the semiconductor chip and to the substrate such that a first end of the bonding wire is attached to the copper-containing surface and a second end of the bonding wire is attached to a substrate bonding pad on the substrate.

20 Claims, 10 Drawing Sheets

WIRE BONDING USING IN-SITU PLASMA TREATMENT AND APPARATUS FOR EFFECTING THE SAME

BACKGROUND

Traditional wire bonding processes are limited due to oxide formation on metallic surfaces. Due to concern for oxide formation, use of NiAu/Electroless Nickel Electroless Palladium Immersion Gold (ENEPIG) surface finish has been promoted in bonding pads in order to provide Au/Ag/Cu wire bonding thereupon.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
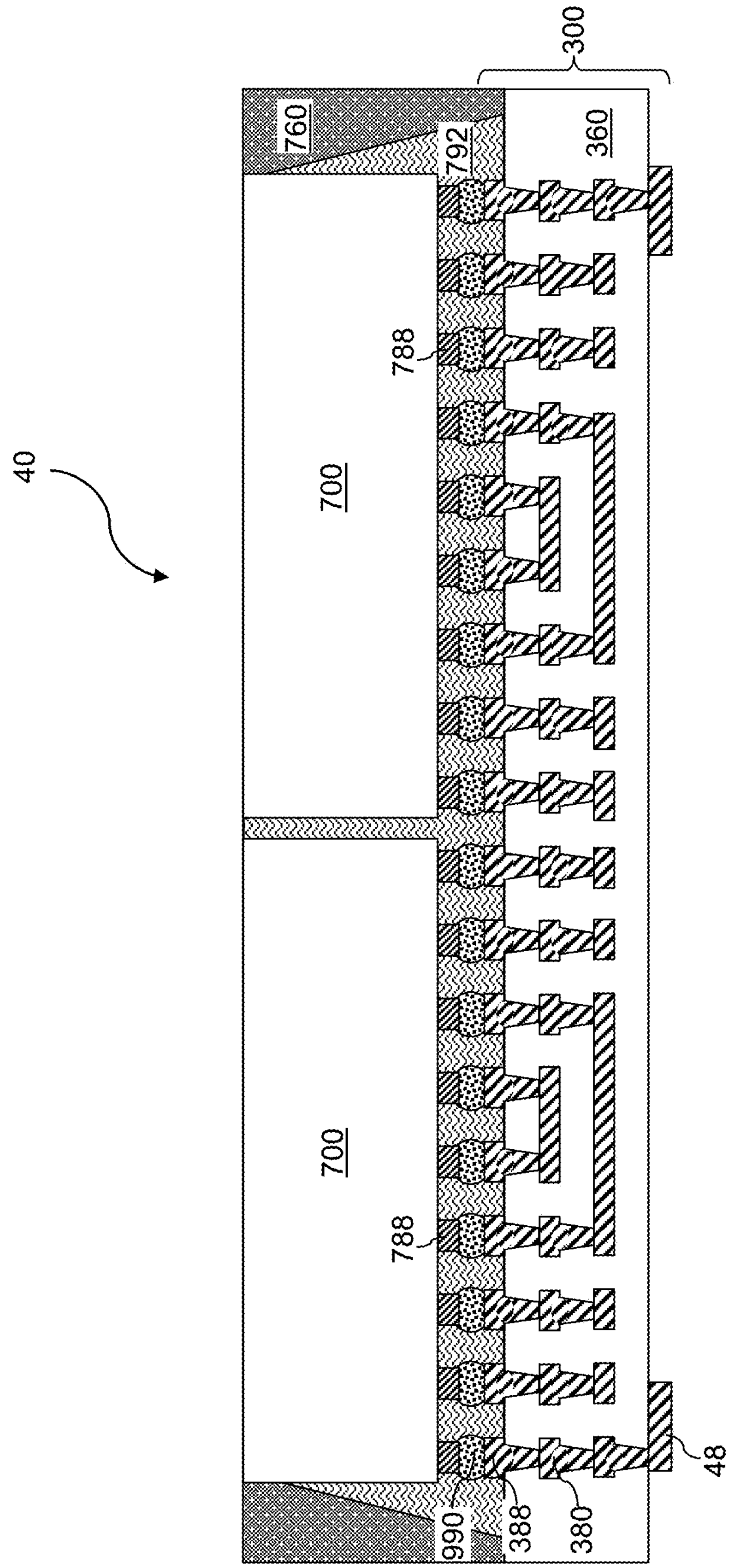
FIG. 1A is a vertical cross-sectional view of a first exemplary semiconductor chip including at least one semiconductor die and an interposer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Bonding a semiconductor chip to a substrate is a critical step in the manufacturing of electronic devices, as it ensures that the semiconductor chip is properly connected to the substrate and functions as intended during usage. Many semiconductor chips use metal pads composed primarily of copper. However, copper surfaces suffer from easy oxidation, i.e., formation of a surface copper oxide layer. Copper oxide is a compound that forms on copper surfaces exposed to air or other oxidizing agents. The presence of copper oxide on a copper pad may severely degrade adhesion and contact resistance of a stitch. Thus, the bond between a copper pad and a stitch is typically unreliable electrically and structurally due to presence of interfacial copper oxide. While copper oxide may be temporarily removed using a surface clean method, additional copper oxide may readily grow prior to bonding a bonding wire on a copper pad. As a result, use of gold plating on top surfaces of copper pads has become a popular method for achieving reliable electrical contacts in the semiconductor industry, as gold surfaces do not suffer from oxidation.

Wire bonding is a common process used in semiconductor manufacturing to connect wires to metal pads on a semiconductor device to create an electrical connection. However, during the wire bonding process, oxide formation may occur. This oxide formation may result in a number of problems. These problems may include: poor bonding strength; increased electrical resistance, reduced wire adhesion and wire breakage. For example, oxides that form on the metal pads may create a barrier between the wire and the metal pad. This barrier may reduce the strength of the bond and may result in a connection failure or device malfunction. Oxides may increase electrical resistance of the bond and may ultimately reduce the performance of the device. Oxides may also reduce the ability of the wire to adhere to the metal pad. This may result in poor wire placement and stability. In some embodiments, oxides may cause a wire to break during the bonding process. This may in turn lead to manufacturing defects.

According to an embodiment of the present disclosure, atmospheric pressure plasma jet (APPJ) treatment may be performed in-situ to clean surface contaminants from bonding structures prior to, and during, attaching a wire to a copper surface of a copper-based bonding pad. Thus, a semiconductor chip including copper pads may be bonded to a substrate without formation of any additional metal layer such as a gold layer by using an in-situ APPJ clean process and a wire bonding process. Various aspects of the present disclosure are now described with reference to the accompanying drawings.

Referring to FIG. 1A, a first exemplary semiconductor chip 40 is used, which may be subsequently used to form a bonded assembly of a semiconductor chip 40 and a substrate according to an embodiment of the present disclosure. The first exemplary semiconductor chip 40 may be a composite chip including an assembly of at least one semiconductor die 700 and an interposer 300 including redistribution metal interconnects 380 embedded in redistribution dielectric layers 360.

The redistribution dielectric layers 360 include a respective dielectric polymer material such as polyimide (PI), benzocyclobutene (BCB), or polybenzobisoxazole (PBO). Each redistribution dielectric layer 360 may be formed by spin coating and drying of the respective dielectric polymer material. The thickness of each redistribution dielectric layer 360 may be in a range from 2 microns to 40 microns, such as from 4 microns to 20 microns.

Each of the redistribution wiring interconnects 380 may comprise a respective stack of a metallic seed layer and an electroplated metallic fill material (such as copper, nickel, or a stack of copper and nickel). The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the redistribution wiring interconnects 380 may include copper, nickel, or copper and nickel. The thickness of each line portion of the redistribution wiring interconnects 380 may be in a range from 2 microns to 40 microns, such as from 4 microns to 10 microns, although lesser or greater thicknesses may also be used. The total number of levels of wiring in the interposer 300 may be in a range from 1 to 10.

The interposer 300 may comprise on-interposer bump structures 388, which are used to attach the at least one semiconductor die 700. The metallic material of the on-interposer bump structures 388 may include copper. Other metallic materials are within the contemplated scope of disclosure. The on-interposer bump structures 388 may have horizontal cross-sectional shapes of rectangles, rounded rectangles, or circles. Other horizontal cross-sectional shapes may be within the contemplated scope of disclosure. Typically, the on-interposer bump structures 388 may be configured for microbump bonding, and may have a thickness in a range from 10 microns to 100 microns, although lesser or greater thicknesses may also be used. In such an embodiment, the on-interposer bump structures 388 may be formed as an array of microbumps (such as copper pillars) having a lateral dimension in a range from 10 microns to 50 microns, and having a pitch in a range from 20 microns to 100 microns.

The at least one semiconductor die 700 may include any set of semiconductor dies known in the art. In one embodiment, each at least one semiconductor die 700 may include at least one system-on-chip (SoC) die and/or at least one memory die. Optionally, the at least one semiconductor die 700 may include at least one surface mount die known in the art. Each SoC die may comprise an application processor die, a central processing unit die, or a graphic processing unit die. In one embodiment, the at least one memory die may comprise a high bandwidth memory (HBM) die that includes a vertical stack of static random access memory dies. In one embodiment, the at least one semiconductor die 700 may include at least one system-on-chip (SoC) die and at least one high bandwidth memory (HBM) die. Each HBM die may comprise a vertical stack of static random access memory (SRAM) dies that are interconnected to one another through arrays of microbumps and are laterally surrounded by a respective molding material enclosure frame.

Each semiconductor die 700 may comprise a respective array of on-die bump structures 788. Each array of on-die bump structures 788 may be bonded to an array of on-interposer bump structures 388 through a respective array of solder material portions 990. An underfill material portion 792 may laterally surround the array(s) of solder material portions 990. A molding compound matrix 760 may laterally surround the underfill material portion 792 and the at least one semiconductor die 700.

Figure 1B:
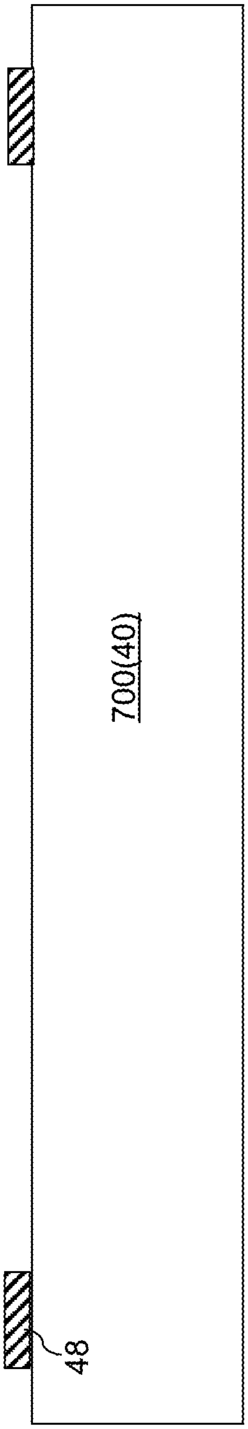
FIG. 1B is a vertical cross-sectional view of a second exemplary semiconductor chip consisting of a single semiconductor die according to an embodiment of the present disclosure.

Referring to FIG. 1B, the first embodiment semiconductor chip 40 may comprise chip bonding pads 48. In one embodiment, the chip bonding pads 48 may be located on the redistribution dielectric layers 360 such that surfaces of the chip bonding pads 48 are physically exposed. In one embodiment, the chip bonding pads 48 may comprise a layer stack including a metallic seed layer and an electroplated copper. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The electroplated copper comprises copper at an atomic percentage in a range from 95% to 99.9999%. The thickness of the electroplated copper material may be in a range from 4 microns to 30 microns, such as from 6 microns to 20 microns, although lesser or greater thicknesses may also be used.

Referring to FIG. 1B, a second embodiment semiconductor chip 40 is used, which consists of a semiconductor die 700. The semiconductor die may be any of the semiconductor dies 700 discussed with reference to FIG. 1A. Chip bonding pads 48 may be provided directly on the semiconductor die 700 (as opposed to on the redistribution dielectric layers 360 of the interposer 300 shown in FIG. 1A). Generally, the chip bonding pads 48 of the semiconductor die 700 may have the same material composition and the same thickness range as the chip bonding pads 48 discussed with reference to FIG. 1A. In one embodiment, the chip bonding pads 48 may comprise a layer stack including a metallic seed layer and an electroplated copper. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The electroplated copper comprises copper at an atomic percentage in a range from 95% to 99.9999%. The thickness of the electroplated copper material may be in a range from 4 microns to 30 microns, such as from 6 microns to 20 microns, although lesser or greater thicknesses may also be used.

Figure 2:
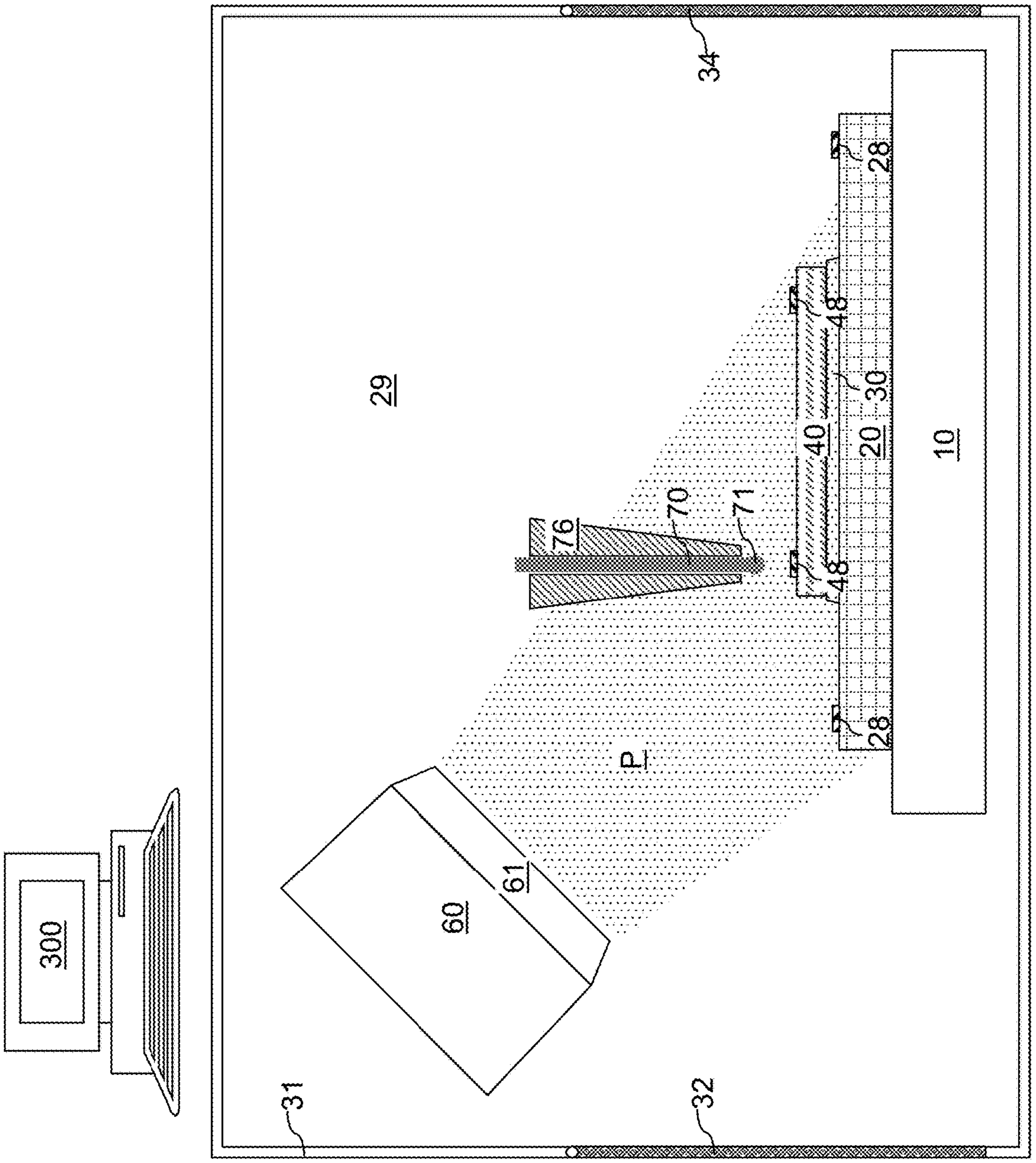
FIG. 2 is a vertical cross-sectional view of an exemplary bonding apparatus prior to bonding a bonding wire to a semiconductor chip or to a substrate according to an embodiment of the present disclosure.

Referring to FIG. 2, an embodiment bonding apparatus is illustrated. The embodiment bonding apparatus comprises a process chamber (31, 32, 34) including chamber enclosure 31 and an ambient control system configured to provide a low-oxygen ambient 29 within a volume that is spatially bounded by the chamber enclosure 31. As used herein, a "low-pressure ambient" refers to an ambient having an oxygen partial pressure that is lower than the oxygen partial pressure (of about 21.23 kPa) in a standard atmospheric condition. In one embodiment, the low-oxygen ambient 29 may have an oxygen partial pressure that is lower than about 80% of the oxygen partial pressure in standard atmospheric conditions, such as lower than 17 kPa. The total pressure of the low-oxygen ambient 29 may be in a range from 10 Pa to 120 kPa. The atmospheric pressure in the standard atmospheric condition is 101.33 kPa. In one embodiment, the partial pressure of oxygen in the low-oxygen ambient 29 may be in a range from $1.0\times10^{-6}$ Pa to 10.13 kPa. Generally, the low oxygen partial pressure in the low-oxygen ambient 29 may be provided by reducing the total pressure of the low-oxygen ambient 29 and/or by reducing the fraction of oxygen in the composition of the ambient gas in the low-oxygen ambient 29. In one embodiment, the molecular fraction of oxygen in the low-oxygen ambient 29 may be in a range from $1.0\times10^{-9}$ to 0.2095 (which is the fraction of oxygen atoms in the normal atmospheric composition). A suitable mechanism (not expressly shown) such as an ambient gas supply nozzle, an exhaust port, and/or a vacuum pumping port may be provided as needed to maintain the composition and the pressure of the low-oxygen ambient 29 at a pre-determined level.

The chamber enclosure 31 may comprise a first opening and a second opening. A first door 32 may be provided at the first opening in a manner that provides sealing of a volume that is enclosed by the chamber enclosure 31. A second door 34 may be provided at the second opening in a manner that provides sealing of the volume that is enclosed by the chamber enclosure 31. Suitable door actuation mechanisms may be provided for the first door 32 and the second door 34 so that the first door 32 and the second door 34 may be opened and closed to provide transport of semiconductor packages and packaging substrates in and out of the chamber enclosure 31. While the present disclosure is described using an embodiment in which a first door 32 and a second door 34 are located on opposite sides of the low-oxygen ambient, embodiments are expressly contemplated herein in which the first door 32 and the second door 34 are arranged differently, or merged as a single door.

A plasma treatment system 60 is provided within the process chamber (31, 32, 34). The plasma treatment system 60 is configured to generate a plasma jet P. The plasma treatment system 60 comprises a plasma nozzle 61 configured to generate a respective atmospheric pressure plasma jet P containing ions of a reducing gas, i.e., a gas that may combine with oxygen atoms to de-oxidize a surface. The plasma nozzle 61 of the plasma treatment system 60 may be configured such that the plasma jet P is directed toward chip bonding pads 48 formed on a semiconductor chip 40. The plasma jet P direction of the plasma treatment system 60 may, or may not, be tilted with respect to the vertical direction, and may be tilted with respect to the horizontal direction. The tilt angle of each plasma jet P direction relative to the vertical direction may be generally in a range from 0 degree to +85 degrees, such as from 15 degrees to 60 degrees, although lesser and greater tilt angles may also be used. Generally, the tilt angle may be a fixed angle, or may be a in-situ controllable variable angle.

A stage 10 is provided in the process chamber (31, 32, 34). The stage 10 is configured to mount a substrate thereupon. The substrate may be a packaging substrate, a leadframe, or a wafer including an array of semiconductor dies. The stage 10 may comprise movement mechanisms configured to provide lateral movements and/or vertical movements to the stage 10.

A bond capillary 76 containing a bonding wire 70 may be provided within the process chamber (31, 32, 34). The bond capillary 76 may be a commercially available bond capillary. The bonding wire 70 may be composed of a high-electrical-conductivity metal such as gold, silver, or aluminum. In one embodiment, the bonding wire 70 may be a gold wire having a diameter in a range from 15 microns to 75 microns, such as from 30 microns to 50 microns, although lesser and greater diameters may also be used.

A free air ball 71 may be provided at the bottom end of the bonding wire 70. The free air ball 71 may be formed by applying heat and/or ultrasonic energy to the bottom end of the bonding wire 70, and by locally melting the material of the bonding wire 70. The free air ball 71 comprises the same material as the bonding wire 70, and does not include any solder material. The free air ball 71 may be formed without any spatial confinement, i.e., in "free air," and is not in contact with any sold surface other than a remaining portion of the bonding wire 70.

A substrate 20 may be loaded into the process chamber (31, 32, 34). The substrate 20 may comprise any structure to which a semiconductor chip 40 may be attached to by wire bonding. In one embodiment, the substrate 20 may comprise a packaging substate, a leadframe, or a wafer including a two-dimensional array of semiconductor dies that may be subsequently diced along dicing channels.

A "packaging substrate" herein refers to any substrate to which a semiconductor chip may be attached so that the semiconductor chip may be attached to a printed circuit board through the substrate. Examples of the packaging substrates include organic packaging substrates, ceramic packaging substrates, flexible packaging substrates, multi-core packaging substrates, glass packaging substrates, silicon packaging substrates, etc.

A "leadframe" herein refers to a thin metal frame that provides a structural foundation for mounting and interconnecting semiconductor devices, such as integrated circuits and light-emitting diodes (LEDs). The leadframe typically comprises a flat metal strip, usually made of copper or a copper alloy, that has a number of leads or pins arranged in a pattern. The leads or pins of the leadframe provide the electrical connection between the semiconductor device and an external electrical component such as a printed circuit board. The leadframe also provides a means of mechanical support and protection for the device, as it may be encapsulated in a plastic or ceramic package that protects the assembly of a semiconductor chip 40 and the leadframe from external environmental factors, such as moisture, dust, and mechanical shock.

In embodiments in which the substrate 20 comprises an array of semiconductor dies (e.g., semiconductor die 700) located within a wafer, such as a semiconductor wafer, each of the semiconductor chips 40 may be bonded to a respective semiconductor die 700 within the wafer.

The substrate 20 comprises an array of bonding pads, which is herein referred to as an array of substrate bonding pads 28. In one embodiment, each of the substrate bonding pads 28 may comprise a layer stack of multiple metal layers containing a gold layer as a topmost layer.

In an illustrative example, each of the substrate bonding pads 28 may comprise a NiAu (nickel-gold) layer stack. The NiAu layer stack comprises a nickel layer, which may be deposited directly on an underlying metal surface (such as a copper surface), and serves as a seed layer, a diffusion barrier layer, and as an adhesion promotion layer for a gold layer to be subsequently deposited thereupon. The gold layer may be deposited over, and directly on, the nickel layer and serves as the final layer for wire bonding. The gold layer provides excellent mechanical and electrical properties and is highly resistant to oxidation and corrosion. Generally, the gold layer does not include a surface oxide layer thereupon, and is conducive to wire bonding. The gold layer provides a smooth, low-resistance surface that is suitable for making strong, reliable wire bonds. The nickel layer is covered and protected by the gold layer, and thus, does not interact with the ambient.

In another illustrative example, each of the substrate bonding pads 28 may comprise an ENEPIG (electroless nickel electroless palladium immersion gold) stack. The ENEPIG stack comprises an electroless nickel layer, which may be deposited directly on an underlying metal surface (such as a copper surface), and serves as a seed layer, a diffusion barrier layer, and as an adhesion promotion layer for subsequently deposited layers. The electroless palladium layer is an intermediary layer for enhancing adhesion for the subsequently gold layer, and enhances corrosion resistance of the final surface. The immersion gold layer forms a thin, corrosion-resistant gold layer that is suitable for wire bonding, and protects underlying metal layers. The ENEPIG stack provides a surface finish that is suitable for wire bonding, and also provides high reliability, and good corrosion resistance.

A semiconductor chip 40 may be disposed over the substrate 20. The semiconductor chip 40 may comprise any semiconductor chip 40 as discussed with reference to FIGS. 1A and 1B. An adhesive layer 30 may be optionally used to affix the semiconductor chip 40 on the top surface of the substrate 20. Generally, the semiconductor chip 40 may be aligned over the substrate 20 such that the chip bonding pads 48 and the substrate bonding pads 28 are physically exposed to the low oxygen ambient 29.

Generally, a low-oxygen ambient 29 having an oxygen partial pressure that is lower than 17 kPa is provided in a process chamber having a chamber enclosure 31. A substrate 20 comprising substrate bonding pads 28 and a semiconductor chip 40 comprising chip bonding pads 48 may be provided in the low-oxygen ambient 29, for example, by loading into the process chamber. The semiconductor chip 40 is disposed on the substrate 20 such that the chip bonding pads 48 and the substrate bonding pads 28 are exposed to the low-oxygen ambient 29.

In one embodiment, the semiconductor chip 40 may comprise a composite chip including an assembly of at least one semiconductor die 700 and an interposer 300 including redistribution metal interconnects 380 embedded in redistribution dielectric layers 360, and the chip bonding pad 48 may be located on the redistribution dielectric layers 360.

In one embodiment, the chip bonding pads 48 may have copper-containing surfaces as a bonding surfaces. In one embodiment, the chip bonding pads 48 may comprise an electroplated copper material containing copper atoms at an atomic percentage in a range from 95% to 99.9999%. The copper-containing surfaces may be surfaces of the electroplated copper material.

In one embodiment, the substrate 20 may be one of a packaging substrate, a leadframe, and a wafer including a two-dimensional array of semiconductor dies. In one embodiment, each of the substrate bonding pads 28 comprises a layer stack of multiple metal layers containing a gold layer as a topmost layer.

After the semiconductor chip 40 is disposed on the substrate 20, a plasma treatment process may be performed in the low-oxygen ambient 29 by directing a plasma jet P to at least one chip bonding pad 48 selected from the chip bonding pads 48. According to an aspect of the present disclosure, the chip bonding pads 48 of the semiconductor chip 40 may be cleaned to remove surface oxide located on copper-containing surfaces of the chip bonding pads 48. Specifically, the plasma treatment system 60 forms a reducing plasma (i.e., a de-oxidizing plasma) around the chip bonding pads 48 by generating a plasma jet P, which is an atmospheric pressure plasma jet (APPJ). Generally, an atmospheric pressure plasma jet (APPJ) may be generated by passing a gas (such as air, argon, or helium) through a high voltage electrical discharge. The resulting plasma is composed of highly reactive species, such as ions and radicals, which may be used for a variety of industrial and research applications.

APPJ treatment is a process used in semiconductor fabrication to clean, activate and treat surfaces. APPJ uses a low-temperature plasma, generated at atmospheric pressure, to modify the surface chemistry of a material. Plasma is a state of matter that is created when a gas is ionized, or when its atoms are stripped of some of their electrons, creating mixture of ions, electrons, and neutral particles. Plasma may be created at a variety of pressures, including atmospheric pressure.

The APPJ system typically comprises a plasma generator, a gas feed system, and a nozzle that directs the plasma onto the surface to be treated. The plasma may be generated by introducing a gas, such as argon or oxygen, into the plasma generator, where it is excited by an electrical discharge. The plasma generator may create a plasma, which is then directed through the nozzle and onto the surface to be treated. APPJ may be a non-contact, low-temperature, and low-pressure process, which makes APPJ compatible with a wide range of materials and may be easily integrated into existing semiconductor fabrication processes.

The generated high-energy plasma of an APPJ system may remove contaminants and particles from surfaces, providing a clean surface for subsequent processing steps. The plasma may modify the surface chemistry of a material, increasing the reactivity of the material and making the material more suitable for subsequent processing steps. The plasma may also be used to deposit thin films or change the surface morphology of a material. The plasma may be used to remove or passivate surface oxides and other unwanted surface layers. The plasma may also be used to change the surface energy of a material to improve the adhesion of subsequent layers.

According to an aspect of the present disclosure, the APPJ from the plasma treatment system 60 is used for surface cleaning. Specifically, ions in each plasma jet P may be directed toward the chip bonding pads 48 to clean the surfaces of the chip bonding pads 48. The high energy species in the plasma interact with the surfaces, thereby breaking down, and removing, contaminants on the chip bonding pads 48. In one embodiment, each plasma jet P uses ions of a reducing gas to reduce and/or remove contaminants (such as oxygen or water vapor) on the surfaces of the chip bonding pads 48. A reducing gas is mixed with a respective plasma jet P, and the resulting reactive species are directed towards the surfaces to be cleaned, effectively reducing and removing the contaminants on the surfaces.

Reducing gases that may be used to for each plasma jet P from the plasma treatment system 60 may include, but are not limited, to hydrogen, various hydride gases (such as methane, ammonia, acetylene, etc.), carbon monoxide, and various volatile compounds including hydrogen radicals. Hydrogen gas is a strong reducing agent and may be used to remove oxides, sulfates, and other contaminants from surfaces. Methane is a hydrocarbon gas that may be used to remove carbon-based by contaminants from surfaces. Ammonia is a weak reducing agent that may be used to remove nitrides and other nitrogen-based contaminants from surfaces. Carbon dioxide may be used to remove organic contaminants from surfaces. Nitrogen may be used to remove oxygen-based contaminants. Propane is a hydrocarbon gas that may be used to remove carbon-based contaminants from surfaces. In some other embodiments, non-reducing gases such as argon and helium may be optionally used to cool down the plasma, and/or to protect the plasma jet and to improve the plasma properties. Generally, any ion that acts as a reducing agent may be used. Each atmospheric pressure plasma jets generated by the plasma treatment system 60 does not need to be at an "atmospheric" pressure, but may be any pressure that may be used to generate the condition of an atmospheric pressure plasma jet known in the art. Generally, the plasma treatment process may be performed in the low-oxygen ambient 29, which has an oxygen partial pressure that is lower than 17 kPa.

A process controller 400 may be provided, which comprises a processor and a memory in communication with the processor. The process controller 400 may be loaded with a program that controls loading and positioning of the semiconductor chip 40 and the substrate 20, and/or controls the direction, the areal coverage, the duration, and/or the magnitude of the plasma jet P generated by the plasma treatment system 60. Surface oxides may be removed from the copper-containing surfaces of the chip bonding pads 48.

The plasma treatment process may be performed on a copper-containing surface of at least one chip bonding pad 48 (including, for example, a first chip bonding pad 48) on the semiconductor chip 40 in the low-oxygen ambient 29 by directing a plasma jet P to the chip bonding pad 48. The plasma jet P may be generated by a plasma treatment system 60 having a plasma nozzle 61 that is directed toward the chip bonding pad 48. In one embodiment, the plasma nozzle 61 is directed at the copper-containing surface along a downward non-horizontal direction while the copper-containing surface is oriented along a horizontal direction during the plasma treatment process. The plasma jet P may simultaneously clean one of the chip bonding pads 48 (which is herein referred to as a first chip bonding pad 48) and one of the substrate bonding pads 28 (which is herein referred to as a first substrate bonding pad 28).

Figure 3:
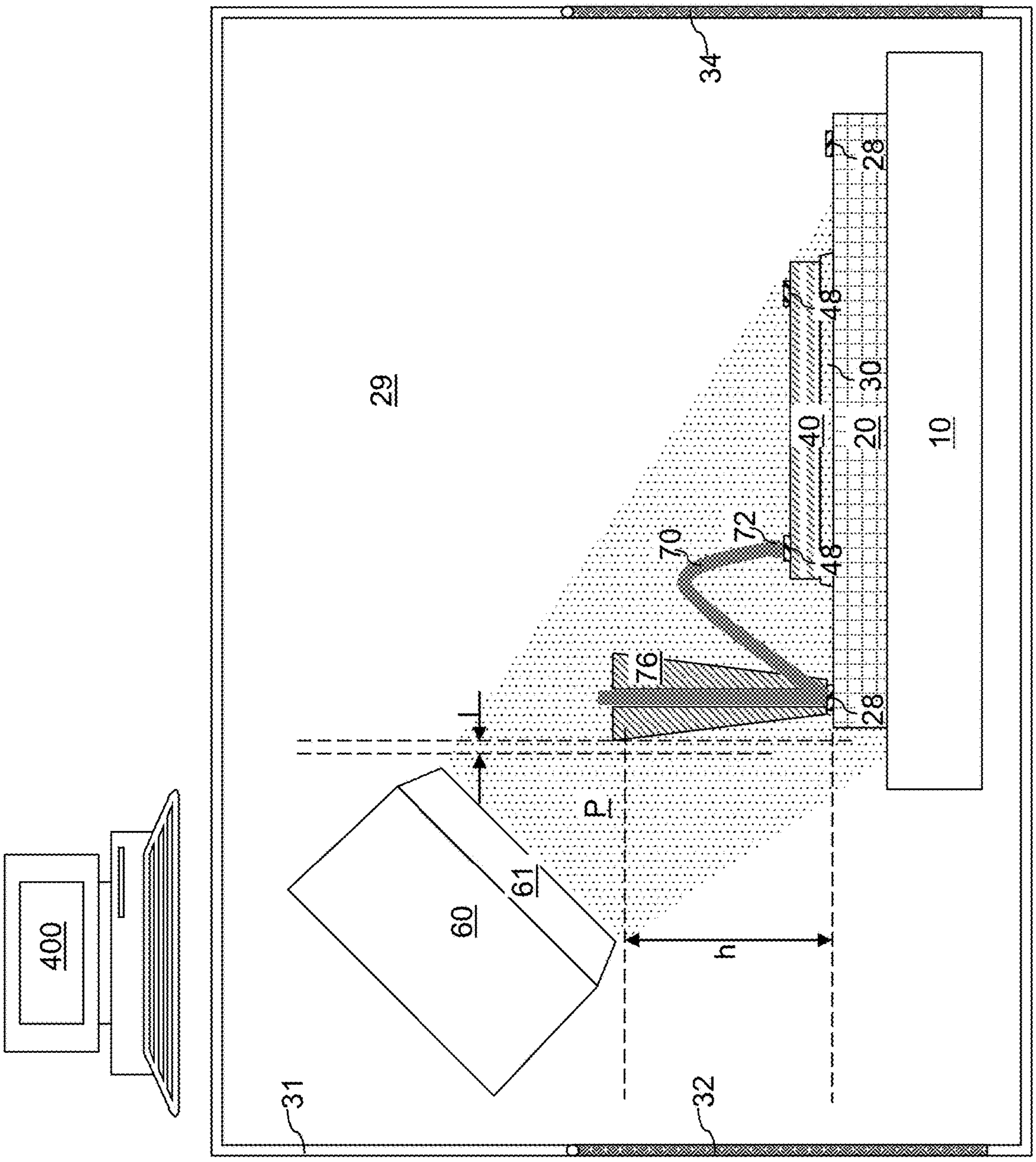
FIG. 3 is a vertical cross-sectional view of the exemplary bonding apparatus after bonding a bonding wire to a chip bonding pad according to an embodiment of the present disclosure.

Referring to FIG. 3, the free air ball 71 of the bonding wire 70 is attached to a chip bonding pad 48 (such as a first chip bonding pad 48) to provide metal-to-metal contact. For example, the bond capillary 76 may move to a position located directly above the first chip bonding pad 48. The bonding wire 70 may be pulled down through the bond capillary 76 and onto the first chip bonding pad 48. As the bonding wire 70 is pulled down, the bond capillary 76 may shape the bonding wire 70 into a loop, and presses the free air ball 71 onto the cleaned copper surface of the first chip bonding pad 48. The free air ball 71 solidifies after contact with the copper surface of the first chip bonding pad 48 to provide oxide-interface-free metal-to-metal interface between the electroplated copper material within the first chip bonding pad 48 and the material (such as gold) of the now-solidified material of the free air ball 71. Upon attachment to the first chip bonding pad 48, the free air ball 71 becomes a metal ball, which is herein referred to as a ball 72. The ball 72 may have the same material composition as the bonding wire 70.

According to an aspect of the present disclosure, the ball 72 may be attached to the first chip bonding pad 48 while the plasma treatment process is performed on the first chip bonding pad 48 by directing a plasma jet P to the copper-containing surface of the first chip bonding pad 48 in the low-oxygen ambient 29. A first end of the bonding wire 70 may be attached to the copper-containing surface of the first chip bonding pad 48 through the ball 72. Thus, the first end of the bonding wire 70 is bonded to the first chip bonding pad 48 during the plasma treatment process.

It is understood that the shape and length of the bonding wire 70 changes during the bonding process. To the extent that the shape and length of the bonding wire 70 changes during processing, the bonding wire 70 may also be referred to as an in-process bonding wire 70, i.e., a bonding wire that undergoes a change during processing. Generally, a first end of an in-process bonding wire 70 may be attached to a copper-containing surface of a chip bonding pad 48, and a portion of the in-process bonding wire 70 may be subsequently attached to a surface of a substrate bonding pad 28.

In one embodiment, the chip bonding pads 48 comprise an electroplated copper material containing copper atoms at an atomic percentage in a range from 95% to 99.9999%, and the copper-containing surface is a surface of the electroplated copper material. In one embodiment, the bonding wire 70 and the ball consist essentially of gold.

Subsequently, the bond capillary 76 may be moved over a substrate bonding pad 28 (such as a first substrate bonding pad 28) while allowing the bonding wire 70 to be pulled through the bond capillary 76. The bonding wire 70 is pulled down toward the substrate bonding pad 28, thereby forming a small indentation that is referred to as a stitch. The bond capillary 76 shapes the bonding wire into a second loop, which is pressed onto the gold-containing surface of the first substrate bonding pad 28. The bond capillary 76 then applies pressure and heat to the portion of the bonding wire 70 in contact with the first substrate bonding pad 28. The portion of the bonding wire 70 in contact with the surface of the first substrate bonding pad 28 is bonded to the top surface of the first substrate bonding pad 28 by the pressure and the heat. The temporary heat causes a stitch portion of the bonding wire 70 to melt and re-solidify on the surface of the first substrate bonding pad 28, thereby forming a metal-to-metal contact without any oxide interface therebetween. In embodiments in which the bonding wire 70 comprises gold, the metal-to-metal contact may be a gold-to-gold contact. According to an embodiment of the present disclosure, a bonding wire 70 may be bonded to the semiconductor chip 40 and to the substrate 20 during the plasma treatment process. In other words, the plasma jet P may impinge on the surface of the first substrate bonding pad 28 while the bonding wire 70 is bonded to the first substrate bonding pad 28.

In one embodiment, the plasma nozzle 61 may be laterally offset from an edge of a bonding capillary 76 by a lateral offset distance greater than 1 mm while attaching the bonding wire 70 to the substrate 20 (i.e., to a substrate bonding pad 28 of the substrate 20); and the plasma nozzle 61 may be vertically offset from a horizontal plane including a top surface of the substrate 20 by a vertical offset distance greater than 0.1 mm while attaching the bonding wire 70 to the substrate 20.

Figure 4:
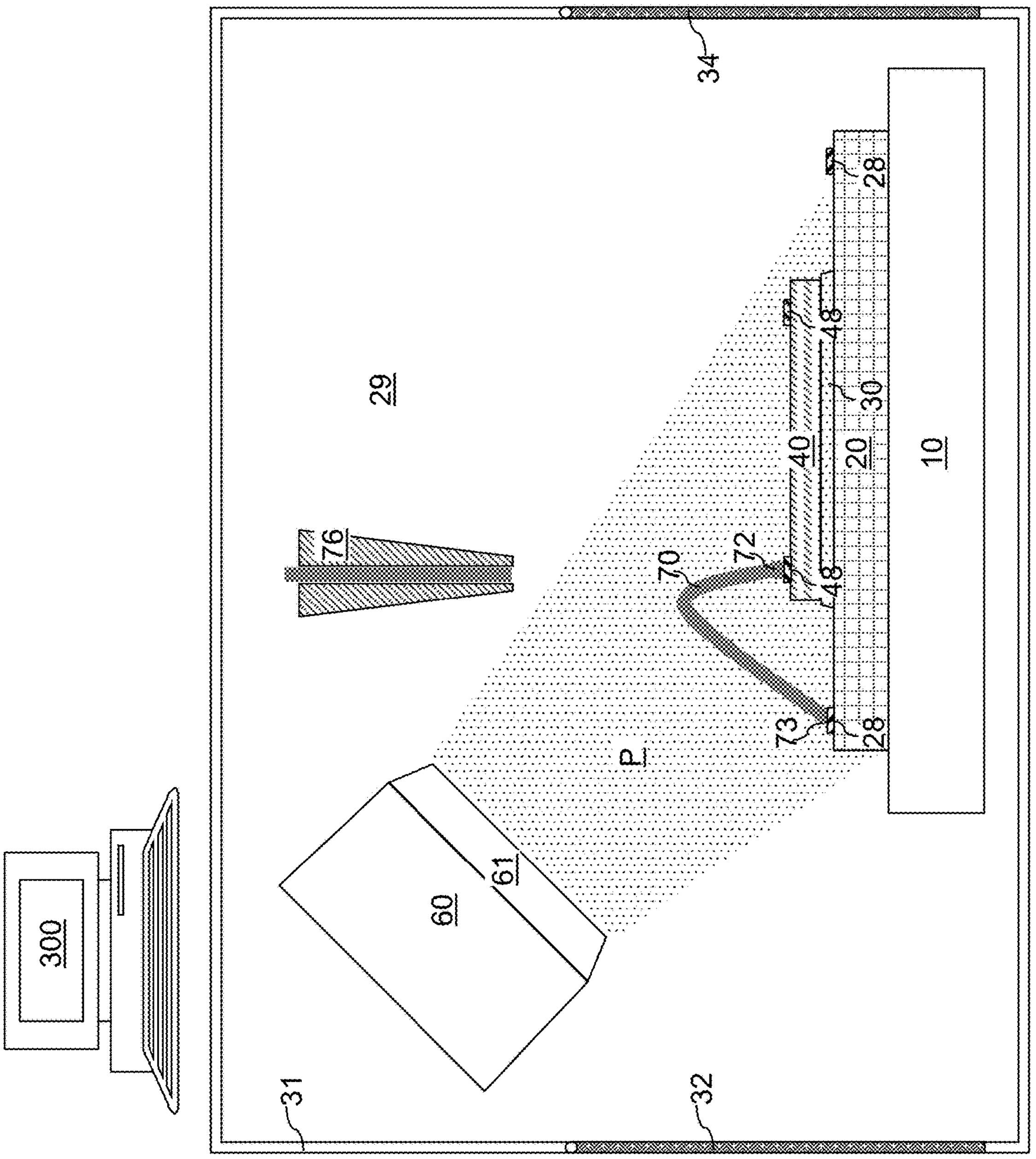
FIG. 4 is a vertical cross-sectional view of the exemplary bonding apparatus after bonding the bonding wire to a substrate bonding pad according to an embodiment of the present disclosure.

Referring to FIG. 4, the portion of the bonding wire 70 that remains in the bond capillary 76 may be cut off from the portion of the bonding wire 70 that connects to the first chip bonding pad 48 to the first substrate bonding pad 28.

Generally, a bonding wire 70 is attached to the semiconductor chip 40 and to the substrate 20 by attaching a portion of an in-process bonding wire 70 to a copper-containing surface of a chip bonding pad 48; by attaching a portion of the in-process bonding wire 70 to a surface of a substrate bonding pad 28; and by truncating the in-process bonding wire 70 such that a remaining portion of the in-process bonding wire 70 constitutes a bonding wire 70 that extends between the copper-containing surface and the surface of the substrate bonding pad 28. Thus, a first end of the bonding wire 70 may be bonded to a chip bonding pad 48, and a second end of the bonding wire 70 may be bonded to a substrate bonding pad 28 on the substrate 20. The bonding wire 70 may be attached to the copper-containing surface through a ball 72, which has the same material composition as the bonding wire 70. The bonding wire 70 may be attached to a surface of the electroplated copper material through a stitch 73. The stitch 73 is a shape or a pattern in which the bonding wire 70 is bonded to the surface of the first substrate bonding pad 28. As a bonding wire 70 is threaded over to the substrate bonding pad 28 of the substrate 20, the bonding wire 70 makes a loop or a pattern, which is the stitch 73. The stitch 73 may have different shapes and geometries, and may be straight, lopped, ball-shaped, or zig-zag shaped. The size, shape, and location of the stitch 73 may be selected in a manner that increases the bond strength, the pull strength, and the electrical resistance of the bonding wire 70.

According to an aspect of the present disclosure, the substrate 20 and the semiconductor chip 40 may be located within the chamber enclosure 31 during the plasma treatment process and during attachment of the bonding wire 70 to the semiconductor chip 40 and to the substrate 20. The plasma jet P may clean an exposed copper-containing surface of a chip bonding pad 48 and an exposed surface of the substrate bonding pad 28 during the plasma clean process, which may commence prior to bonding the bonding wire 70 to the chip bonding pad 48 and terminate after bonding the bonding wire 70 to the substrate bonding pad 28. The first end of a bonding wire 70 may be attached to the copper-containing surface of the chip bonding pad 48 during the plasma treatment process, and the second end of the bonding wire 70 is attached to the substrate bonding pad 28 during the plasma treatment process.

Figure 5A:
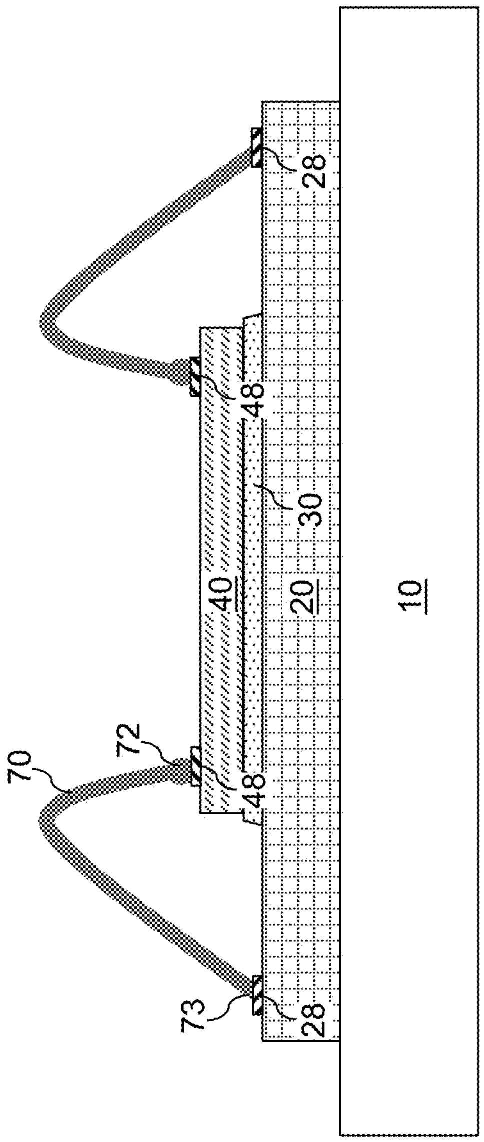
FIG. 5A is a vertical cross-sectional view of a bonded assembly of a semiconductor chip and a substrate according to an embodiment of the present disclosure.
Figure 5B:
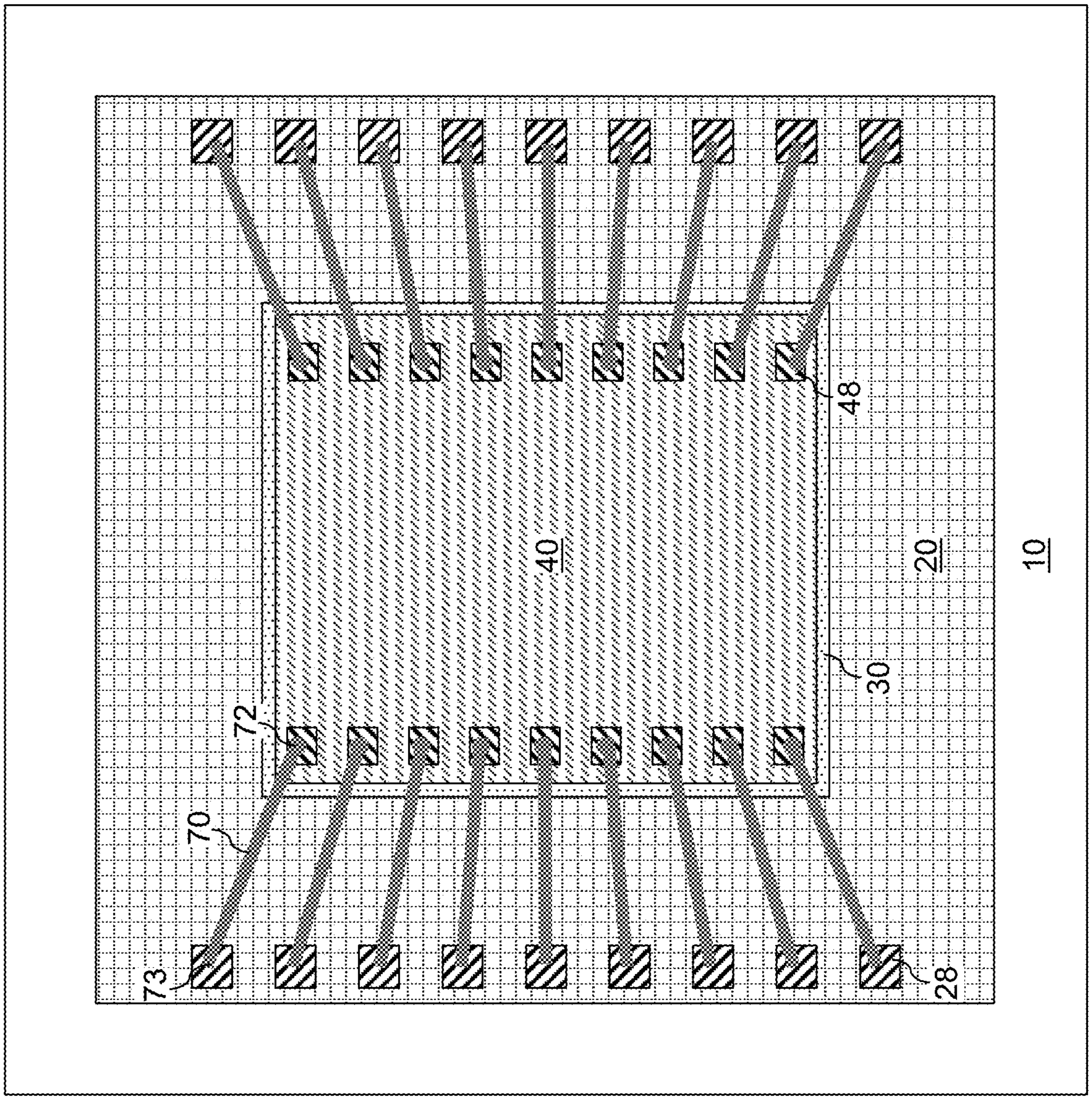
FIG. 5B is a top-down view of the bonded assembly of FIG. 5A.

Referring to FIGS. 5A and 5B, the processing steps described with reference to FIGS. 2-4 may be repeated for each pair of a chip bonding pad 48 and a substrate bonding pad 28 to be electrically connected. The semiconductor chip 40 may be electrically connected to the substrate 20 by wire bonding. Electrical testing may be performed to ensure that all electrical connections are properly made by wire bonding between the semiconductor chip 40 and the substate 20. Corrective actions, such as removal and replacement, and/or repair, of defective bonds may be taken as needed based on the result of the electrical testing.

Figure 6:
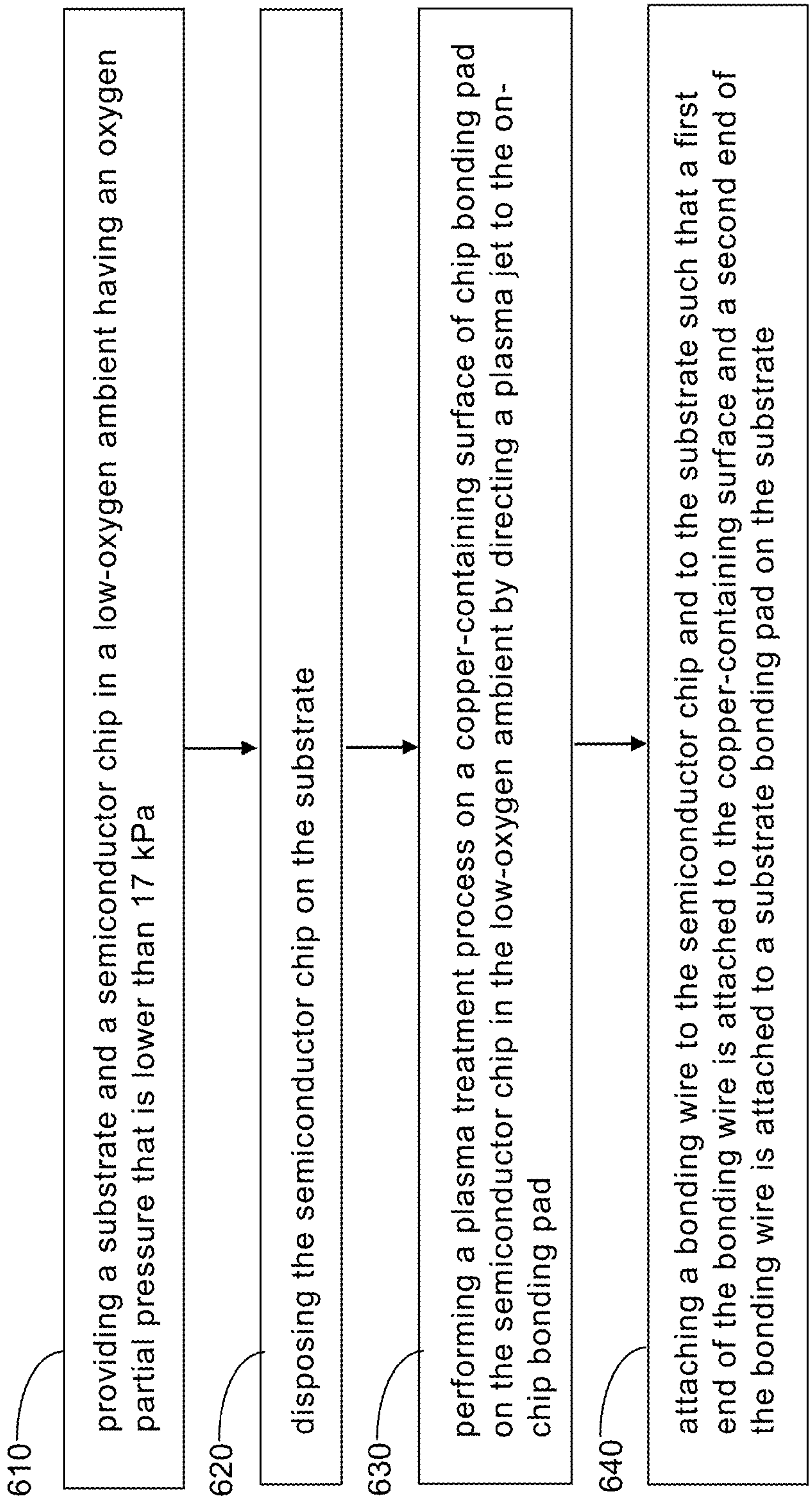
FIG. 6 is a first flowchart illustrating steps for forming a bonded assembly according to an embodiment of the present disclosure.

Referring to FIG. 6, a first flowchart illustrates steps for forming a bonded assembly according to an embodiment of the present disclosure.

Referring to step 610 and FIGS. 1A, 1B, and 2, a substrate 20 and a semiconductor chip 40 may be provided in a low-oxygen ambient 29 having an oxygen partial pressure that is lower than 17 kPa.

Referring to step 620 and FIG. 2, the semiconductor chip 40 may be disposed on the substrate 20.

Referring to step 630 and FIG. 2, a plasma treatment process may be performed on a copper-containing surface of a chip bonding pad 48 on the semiconductor chip 40 in the low-oxygen ambient 29 by directing a plasma jet P to the chip bonding pad 48.

Referring to step 640 and FIGS. 3-5B, a bonding wire 70 may be attached to the semiconductor chip 40 and to the substrate 20 such that a first end of the bonding wire 70 is attached to the copper-containing surface and a second end of the bonding wire 70 is attached to a substrate bonding pad 28 on the substrate 20.

In one embodiment, the chip bonding pad 48 may include an electroplated copper material containing copper atoms at an atomic percentage in a range from 95% to 99.9999%; and the copper-containing surface is a surface of the electroplated copper material. In one embodiment, the bonding wire 70 may be attached to the copper-containing surface through a metal ball 72 having a same material composition as the bonding wire 70; and the bonding wire 70 may be attached to the substrate bonding pad 28 through a stitch 73 having the same material composition as the bonding wire 70. In one embodiment, the plasma jet P may be generated by a plasma treatment system 60 having a plasma nozzle 61 that is directed toward the chip bonding pad 48. In one embodiment, the plasma nozzle 61 may be directed at the copper-containing surface along a downward non-horizontal direction while the copper-containing surface is oriented along a horizontal direction during the plasma treatment process. In one embodiment, the plasma nozzle 61 may be laterally offset from an edge of a bonding capillary by a lateral offset distance greater than 1 mm while attaching the bonding wire 70 to the substrate 20; and the plasma nozzle 61 may be vertically offset from a horizontal plane including a top surface of the substrate 20 by a vertical offset distance greater than 0.1 mm while attaching the bonding wire 70 to the substrate 20. In one embodiment, the bonding wire 70 may be bonded to the semiconductor chip 40 and to the substrate 20 during the plasma treatment process. In one embodiment, the plasma jet P cleans an exposed surface of the substrate bonding pad 28 during the plasma clean process. In one embodiment, the semiconductor chip 40 may include a composite chip including an assembly of at least one semiconductor die 700 and an interposer 300 including redistribution metal interconnects 380 embedded in redistribution dielectric layers 360; and the chip bonding pad 48 is located on the redistribution dielectric layers 360. In one embodiment, the substrate 20 may be one of a packaging substrate, a leadframe, and a wafer including a two-dimensional array of semiconductor dies 700. In one embodiment, the substrate bonding pad 28 comprises a layer stack of multiple metal layers containing a gold layer as a topmost layer. In one embodiment, the bonding wire 70 may be attached to the semiconductor chip 40 and to the substrate 20 by: attaching a first end of an in-process bonding wire 70 to the copper-containing surface of the chip bonding pad 48; attaching a portion of the in-process bonding wire 70 to a surface of the substrate bonding pad 28; truncating the in-process bonding wire 70 such that a remaining portion of the in-process bonding wire constitutes the bonding wire 70 that extends between the copper-containing surface and the surface of the substrate bonding pad 28. In one embodiment, the low-oxygen ambient 29 may be provided in a process chamber (31, 32, 34) having a chamber enclosure 31; and the substrate 20 and the semiconductor chip 40 may be located within the chamber enclosure 31 during the plasma treatment process and during attachment of the bonding wire 70 to the semiconductor chip 40 and to the substrate 20.

Figure 7:
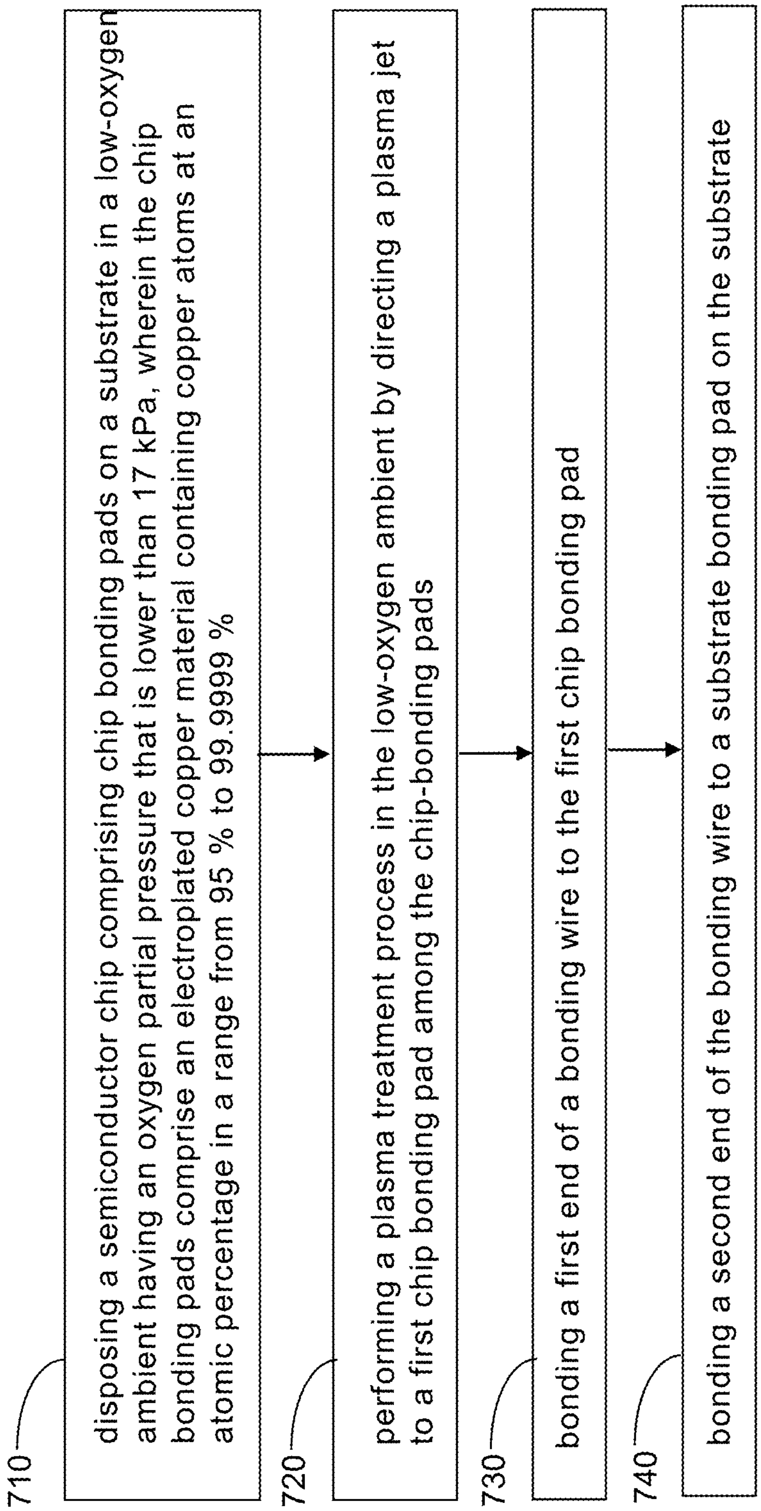
FIG. 7 is a second flowchart illustrating steps for forming a bonded assembly according to an embodiment of the present disclosure.

Referring to FIG. 7, a second flowchart illustrates steps for forming a bonded assembly according to an embodiment of the present disclosure.

Referring to step 710 and FIGS. 1A, 1B, and 2, a semiconductor chip 40 comprising chip bonding pads 48 may be disposed on a substrate 20 in a low-oxygen ambient 29 having an oxygen partial pressure that is lower than 17 kPa. The chip bonding pads 48 comprise an electroplated copper material containing copper atoms at an atomic percentage in a range from 95% to 99.9999%.

Referring to step 720 and FIG. 2, a plasma treatment process may be performed in the low-oxygen ambient 29 by directing a plasma jet P to a first chip bonding pad 48 selected from the chip bonding pads 48.

Referring to step 730 and FIG. 3, a first end of a bonding wire 70 is bonded to the first chip bonding pad 48.

Referring to step 740 and FIGS. 3-5B, a second end of the bonding wire 70 is bonded to a substrate bonding pad 28 on the substrate 20.

In one embodiment, the bonding wire 70 may be attached to a surface of the electroplated copper material through a metal ball 72; and the bonding wire 70 may be attached to the substrate bonding pad 28 through a stitch 73. In one embodiment, the first end of the bonding wire 70 may be bonded to the first chip bonding pad 48 during the plasma treatment process. In one embodiment, the semiconductor chip 40 may include a composite chip including an assembly of at least one semiconductor die 700 and an interposer 300 including redistribution metal interconnects 380 embedded in redistribution dielectric layers 360; and the chip bonding pads 48 may be located on the redistribution dielectric layers 360.

Figure 8:
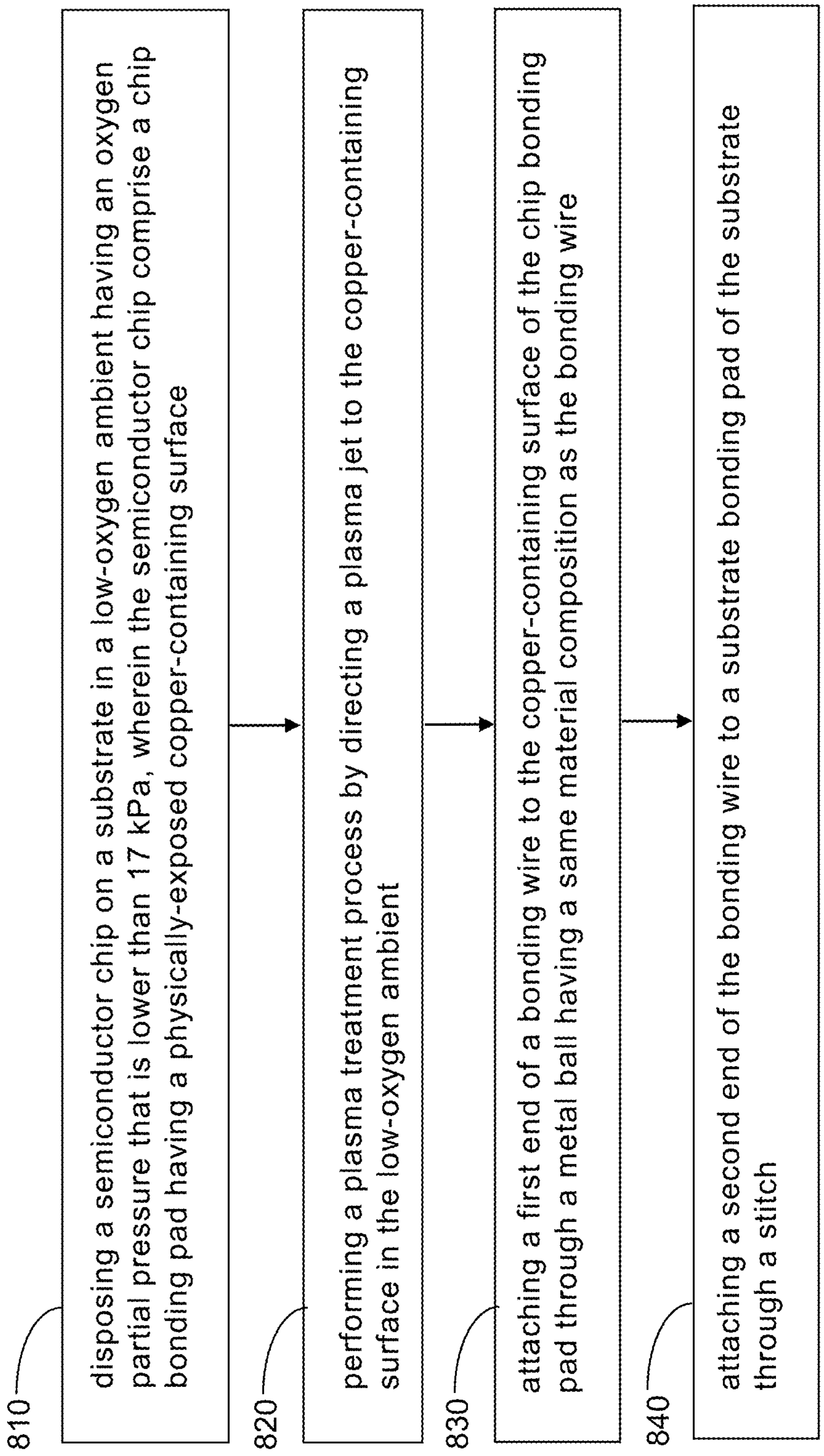
FIG. 8 is a third flowchart illustrating steps for forming a bonded assembly according to an embodiment of the present disclosure.

Referring to FIG. 8, a third flowchart illustrates steps for forming a bonded assembly according to an embodiment of the present disclosure.

Referring to step 810 and FIGS. 1A, 1B, and 2, a semiconductor chip 40 is disposed on a substrate 20 in a low-oxygen ambient 29 having an oxygen partial pressure that is lower than 17 kPa. The semiconductor chip 40 comprise a chip bonding pad 48 having a copper-containing surface.

Referring to step 820 and FIG. 2, a plasma treatment process may be performed by directing a plasma jet P to the copper-containing surface in the low-oxygen ambient 29.

Referring to step 830 and FIG. 3, a first end of a bonding wire 70 is bonded to the copper-containing surface of the chip bonding pad 48 through a metal ball 72 having a same material composition as the bonding wire 70.

Referring to step 840 and FIGS. 3-5B, a second end of the bonding wire 70 to a substrate bonding pad 28 of the substrate 20 through a stitch 73.

In one embodiment, the chip bonding pads 48 may include an electroplated copper material containing copper atoms at an atomic percentage in a range from 95% to 99.9999%; and the copper-containing surface is a surface of the electroplated copper material. In one embodiment, the first end of a bonding wire 70 may be attached to the copper-containing surface of the chip bonding pad 48 during the plasma treatment process; and the second end of the bonding wire 70 may be attached to the substrate bonding pad 28 during the plasma treatment process.

The various embodiments of the present disclosure provide direct bonding of a bonding wire on an electroplated copper portion in a bonding pads, thereby eliminating the need to form a gold layer on the electroplated copper portion prior to a bonding process. The in-situ removal of copper oxide from the physically-exposed surfaces of the electroplated copper portion is provided using a plasma treatment process using atmospheric pressure plasma jet (APPJ), thereby ensuring elimination of any surface oxide between a copper surface and the surface of the metallic material of the bonding wire. Reliable wire bonding may be provided at a lower processing cost.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a bonded assembly, the method comprising:

providing a substrate and a semiconductor chip;

disposing the semiconductor chip on the substrate;

performing a plasma treatment process on a copper-containing surface of a chip bonding pad on the semiconductor chip in a low-oxygen ambient by directing a plasma jet to the chip bonding pad; and attaching a bonding wire to the semiconductor chip and to the substrate during the plasma treatment process such that a first end of the bonding wire is attached to the copper-containing surface and a second end of the bonding wire is attached to a substrate bonding pad on the substrate.

2. The method of claim 1, wherein:

the chip bonding pad comprises an electroplated copper material containing copper atoms at an atomic percentage in a range from 95% to 99.9999%; and the copper-containing surface is a surface of the electroplated copper material.

3. The method of claim 1, wherein:

the bonding wire is attached to the copper-containing surface through a metal ball having a same material composition as the bonding wire; and the bonding wire is attached to the substrate bonding pad through a stitch having the same material composition as the bonding wire.

4. The method of claim 1, wherein the plasma jet is generated by a plasma treatment system having a plasma nozzle that is directed toward the chip bonding pad.

5. The method of claim 4, wherein the plasma nozzle is directed at the copper-containing surface along a downward non-horizontal direction while the copper-containing surface is oriented along a horizontal direction during the plasma treatment process.

6. The method of claim 4, wherein:

the plasma nozzle is laterally offset from an edge of a bonding capillary by a lateral offset distance greater than 1 mm while attaching the bonding wire to the substrate; and the plasma nozzle is vertically offset from a horizontal plane including a top surface of the substrate by a vertical offset distance greater than 0.1 mm while attaching the bonding wire to the substrate.

7. The method of claim 1, wherein the plasma jet cleans an exposed surface of the substrate bonding pad during the plasma treatment process.

8. The method of claim 1, wherein:

the semiconductor chip comprises a composite chip including an assembly of at least one semiconductor die and an interposer including redistribution metal interconnects embedded in redistribution dielectric layers; and the chip bonding pad is located on the redistribution dielectric layers.

9. The method of claim 1, wherein the substrate is one of a packaging substrate, a leadframe, and a wafer including a two-dimensional array of semiconductor dies.

10. The method of claim 1, wherein the substrate bonding pad comprises a layer stack of multiple metal layers containing a gold layer as a topmost layer.

11. The method of claim 1, wherein the bonding wire is attached to the semiconductor chip and to the substrate by:

attaching a first end of an in-process bonding wire to the copper-containing surface of the chip bonding pad;

attaching a portion of the in-process bonding wire to a surface of the substrate bonding pad; and truncating the in-process bonding wire such that a remaining portion of the in-process bonding wire constitutes the bonding wire that extends between the copper-containing surface and the surface of the substrate bonding pad.

12. The method of claim 1, wherein:

the plasma treatment process is performed in a low-oxygen ambient having an oxygen partial pressure that is lower than 17 kPa;

the low-oxygen ambient is provided in a process chamber having a chamber enclosure; and the substrate and the semiconductor chip are located within the chamber enclosure during the plasma treatment process and during attachment of the bonding wire to the semiconductor chip and to the substrate.

13. A method of forming a bonded assembly, the method comprising:

disposing a semiconductor chip comprising chip bonding pads on a substrate in a low-oxygen ambient having an oxygen partial pressure that is lower than 17 kPa, wherein the chip bonding pads comprise an electroplated copper material containing copper atoms at an atomic percentage in a range from 95% to 99.9999%;

performing a plasma treatment process in the low-oxygen ambient by directing a plasma jet to a first chip bonding pad selected from the chip bonding pads;

bonding a first end of a bonding wire to the first chip bonding pad during the plasma treatment process; and bonding a second end of the bonding wire to a substrate bonding pad on the substrate.

14. The method of claim 13, wherein:

the bonding wire is attached to a surface of the electroplated copper material through a metal ball; and the bonding wire is attached to the substrate bonding pad through a stitch.

15. The method of claim 13, wherein:

the semiconductor chip comprises a composite chip including an assembly of at least one semiconductor die and an interposer including redistribution metal interconnects embedded in redistribution dielectric layers; and the chip bonding pads are located on the redistribution dielectric layers.

16. A method of forming a bonded assembly, the method comprising:

disposing a semiconductor chip on a substrate in a low-oxygen ambient having an oxygen partial pressure that is lower than 17 kPa, wherein the semiconductor chip comprise a chip bonding pad having a copper-containing surface;

performing a plasma treatment process by directing a plasma jet to the copper-containing surface in the low-oxygen ambient;

attaching a first end of a bonding wire to the copper-containing surface of the chip bonding pad through a metal ball having a same material composition as the bonding wire during the plasma treatment process; and attaching a second end of the bonding wire to a substrate bonding pad of the substrate through a stitch.

17. The method of claim 16, wherein:

the chip bonding pads comprise an electroplated copper material containing copper atoms at an atomic percentage in a range from 95% to 99.9999%; and the copper-containing surface is a surface of the electroplated copper material.

18. The method of claim 1, wherein the plasma jet is an atmospheric pressure plasma jet containing ions of a reducing gas that combines with oxygen atoms to de-oxidize the copper-containing surface.

19. The method of claim 13, wherein the plasma jet is an atmospheric pressure plasma jet containing ions of a reducing gas that combines with oxygen atoms to de-oxidize a surface of the first chip bonding pad.

20. The method of claim 16, wherein the plasma jet is an atmospheric pressure plasma jet containing ions of a reducing gas that combines with oxygen atoms to de-oxidize the copper-containing surface.

* * * * *